United States Patent [19]

Tabatabaie et al.

[11] Patent Number: 5,420,880
[45] Date of Patent: May 30, 1995

[54] LOW THRESHOLD VERTICAL CAVITY SURFACE EMITTING LASER

[75] Inventors: Ned Tabatabaie, Maple Bluff; Tu Zhang, Madison, both of Wis.

[73] Assignee: Wisconsin Alumni Research Foundation, Madison, Wis.

[21] Appl. No.: 134,396

[22] Filed: Oct. 12, 1993

[51] Int. Cl.$^6$ .............................................. H01S 3/19
[52] U.S. Cl. ........................................ 372/46; 372/45; 372/92
[58] Field of Search ....................... 372/92, 50, 45, 46, 372/19

[56] References Cited

U.S. PATENT DOCUMENTS

| | | | |
|---|---|---|---|
| 5,132,982 | 7/1992 | Chan et al. | 372/50 |
| 5,136,603 | 8/1992 | Hasnain et al. | 372/50 |
| 5,359,618 | 10/1994 | Lebby et al. | 372/46 |
| 5,363,393 | 11/1994 | Uomi et al. | 372/46 |

OTHER PUBLICATIONS

"Surface Emitting Semiconductor Lasers", Kenichi Iga et al, IEEE Journal of Quantum Electronics, vol. 24, No. 9, Sep. 1988, pp. 1856–1854.
"Lasing Characteristics of GaAs Microresonators", J. L. Jewell et al, Appl. Phys. Lett. 54(15), 10 Apr. 1989, pp. 1400–1402.
"Controlled Spontaneous Emission in Microcavity Semiconductor Lasers", *Coherence, Amplification, and Quantum Effects in Semiconductor Lasers*, Edited by Y. Yamamoto, Published by John Wiley & Sons, N.Y., 1991, pp. 561–615 (no month).
"Monolithic Integration of Photodetector With Vertical Cavity Surface Emitting Lasers", G. Hasnain et al, Electronis Letter, vol. 27, No. 18, Aug. 19, 1991, pp. 630–632.
"GaAs Vertical-Cavity Surface Emitting Lasers Fabricated By Reactive Ion Etching", Kent D. Choquette et al, IEEE Photonics Technology Letters, vol. 3, No. 10, Oct. 1991, pp. 859–862.

*Primary Examiner*—James W. Davie
*Attorney, Agent, or Firm*—Andrus, Sceales, Starke & Sawall

[57] ABSTRACT

In a VCSEL, vertical cavity surface emitting laser, lateral traveling mode density is reduced by reducing the number of traveling modes available to spontaneous emission of photons in the active cavity region, to suppress spontaneous emission into lateral traveling modes, to increase spontaneous emission into axial normal modes, to lower lasing threshold. The sidewall of the active cavity region is contoured, preferably by a 90° symmetrical V-shaped notch, to internally reflect laterally traveling photons, to suppress lateral traveling modes.

25 Claims, 4 Drawing Sheets

5,420,880

LOW THRESHOLD VERTICAL CAVITY SURFACE EMITTING LASER

BACKGROUND AND SUMMARY

The invention relates to a VCSEL, vertical cavity surface emitting laser.

A VCSEL diode is an injection diode laser where the laser oscillation and output occur perpendicular to the pn junction plane: "Surface Emitting Semiconductor Lasers", Kenichi Iga et el, IEEE Journal of Quantum Electronics, Vol. 24, No. 9, Sep. 1988, pp. 1845–1854; and "Lasing Characteristics of GaAs Microstructures", J. L. Jewell et el, Applied Physics Letters, Vol. 54, No. 15, 10 Apr. 1989, pp. 1400–1402. Desirable properties include low divergence circular longitudinal axial output, and high two-dimensional packing density for arrays, which make VCSELs attractive for applications such as optical recording, communications, and computing.

A drawback of VCSELs is the relatively large injection current required to reach lasing threshold. A VCSEL emits laser light axially vertically in a direction perpendicular to the pn junction plane. This lasing mode light is also known as the stimulated emission and is emitted into an axial normal mode. A VCSEL also emits light laterally horizontally along a direction parallel to the pn junction plane. The lateral horizontal light has two types of modes, namely: the lateral normal mode for which the emitted light is trapped within the cavity; and the lateral traveling mode, also known as a leaky mode, for which the emitted light escapes the cavity. At low levels of forward bias diode injection current, the lateral traveling modes dominate, and significantly more light is emitted laterally than axially. The lateral light is not coherent laser light. It is not until higher levels of injection current that stimulated emission into an axial normal mode becomes dominant.

In the present invention, lasing threshold is reduced by suppressing spontaneous emission into lateral traveling modes such that stimulated emission into axial normal modes become dominant at lower injection currents, thus lowering lasing threshold.

The present invention provides a simple and effective method and structure for lowering lasing threshold. A particularly desirable advantage of the invention is that it enables usage of a conventional VCSEL epitaxial crystal structure diode, and requires only a simple modification to lower lasing threshold.

DETAILED DESCRIPTION

Prior Art

Figure 1:
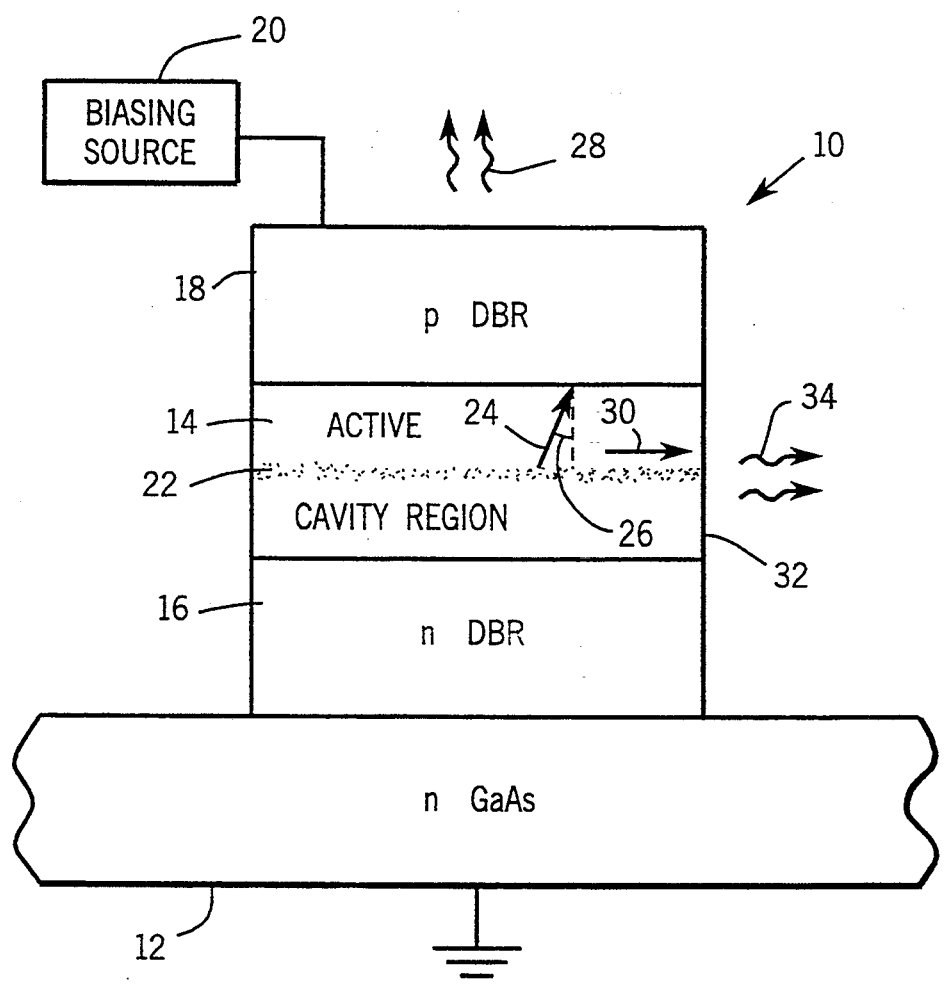
FIG. 1 shows in cross-section a VCSEL, vertical cavity surface emitting laser, known in the prior art.

FIG. 1 shows a VCSEL, vertical cavity surface emitting laser, 10, including a semiconductor substrate 12, such as n type gallium arsenide, and a VCSEL diode integrated thereon. The VCSEL diode includes a plurality of laterally extending horizontal layers, one on top of another, in a vertical axial stack, including an active cavity region 14 sandwiched between an n type multi-layer distributed Bragg reflector, DBR, mirror stack 16, and a p type multi-layer DBR mirror stack 18, and for which further reference is made to the above noted Iga et al, and Jewell et al references. The VCSEL diode is forward biased by a biasing circuit including biasing source 20.

Active cavity region 14 includes a plurality of hole-electron pairs forming dipoles along a laterally horizontally extending quantum well 22. The holes and electrons recombine to emit photons in a process called spontaneous emission. Such photons are emitted in all directions. The photons which strike the DBR mirror stacks 18 and 16 at an angle of incidence less than 20° are reflected by the respective DBR mirror stack as described in "Controlled Spontaneous Emission In Microcavity Semiconductor Lasers", Y. Yamamoto et al, *Coherence, Amplification and Quantum Effects In Semiconductor Lasers,* edited by Y. Yamamoto, John Wiley & Sons, N.Y., 1991, pp. 561–615. This is illustrated at photon directional arrow 24 impinging DBR stack 18 at an angle of incidence 26 less than 20°. It is to be noted that the dimensions of the structure, e.g. the vertical dimension of active cavity region 14 is on the order of a wavelength of light, and hence ray tracing does not fully accurately describe the behavior of light in such active cavity region, though ray tracing does indicate approximate behavior.

Each DBR stack 16 and 18 includes many layers of its respective n or p type material with different indices of refraction which repetitively reflect the photons back and forth over numerous round trips in the vertical axial direction. The lower DBR stack 16 and the upper DBR stack 18 typically have reflectivities greater than 99.9%. Numerous reflected round trips between the DBR mirror stacks ensures that the axially emitted spontaneous emission is into axial normal modes, or waveguide modes, or guided modes. Lasing light or stimulated emission 28 is the amplification of one such axial normal mode.

Photons emitted by the hole-electron pairs and traveling generally horizontally laterally as shown at 30 pass through sidewall 32 of active cavity region 14 of the VCSEL and appear as emitted light at 34. Lateral spontaneous emission light such as 30 which subsequently exit the cavity at 34 are called lateral traveling modes, or leaky modes. Photons impinging sidewall 32 at an angle of incidence greater than the critical angle for total internal reflection, e.g. 17° for a GaAs-air interface, are contained within the cavity 14 and constitute normal modes similar to those in the axial direction.

The number or density of traveling leaky modes is substantially greater than the number of cavity normal modes. Hence, most of the spontaneous emission is emitted into the traveling modes. Consequently, the presence of the traveling leaky modes delays the amplification of the lasing axial normal mode until a higher diode current injection level, increasing the lasing threshold current.

Present Invention

The present invention provides a method and structure for reducing the lasing threshold of a VCSEL diode. This is accomplished by suppressing spontaneous emission into lateral traveling modes, to increase spontaneous emission into axial normal modes, to lower lasing threshold. The suppression of emission of photons in the active cavity region to lateral traveling modes is accomplished by suppressing the escape of traveling modes from the active cavity region. Suppression of escape of traveling modes is in turn accomplished by reflecting laterally traveling photons internally within the active cavity region.

Figure 2:
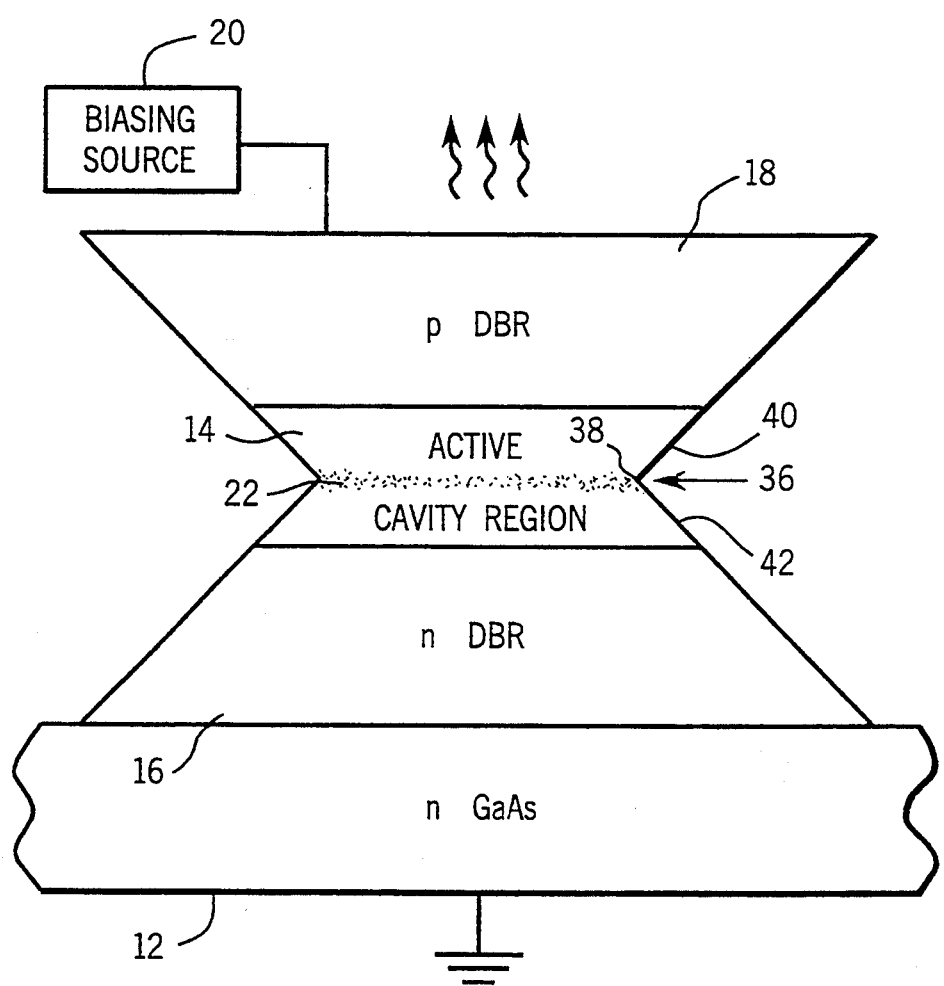
FIG. 2 shows in cross-section a VCSEL in accordance with the invention.

FIG. 2 uses like reference numerals from FIG. 1 where appropriate to facilitate understanding. In FIG. 2, the sidewall of the active cavity region is contoured to reflect laterally traveling photons internally, to provide the noted internal reflection. The sidewall of the active cavity region is etched at an angle to provide the contour. The etch is performed along a diagonal etch line intersecting quantum well 22 at an angle such that spontaneously emitted photons from dipoles along the quantum well impinge the sidewall at an angle of incidence greater than the critical angle for internal reflection.

Quantum well 22 is centrally spaced between the p and n type DBR reflectors 16 and 18. The sidewall of the active cavity region is etched along an angle to form a V-shaped notch 36 in the sidewall. The apex 38 of the V is at quantum well 22. The V-shape has an upper leg 40 extending downwardly and inwardly to apex 38, and a lower leg 42 extending downwardly and outwardly from apex 38. Spontaneously emitted photons from dipoles along quantum well 22 impinge the sidewall along upper leg 40 of the V at an angle of incidence greater than the critical angle for internal reflection. Spontaneously emitted photons from dipoles along quantum well 22 impinge the sidewall along lower leg 42 of the V at an angle of incidence greater than the critical angle for internal reflection. It is preferred that each of legs 40 and 42 extend at a 45° angle relative to vertical, and that there be a 90° angle between legs 40 and 42 at apex 38. The sidewall of the active cavity region is etched by directing a reactive ion flux beam at an angle toward the sidewall, and simultaneously rotating one or the other of the VCSEL substrate and the flux beam about a vertical axis to provide a V-shaped notch with beveled sidewalls extending annularly around the VCSEL. The length of upper notch leg 40 is controlled by the time duration and intensity of the ion beam. It is preferred that the length of upper leg 40 be controlled such that apex 38 is substantially at quantum well 22. The length of lower notch leg 42 is controlled by the width of the mask opening on the substrate through which the ion beam is directed. It is preferred that the lengths of legs 40 and 42 be controlled to be substantially the same.

Figure 3:
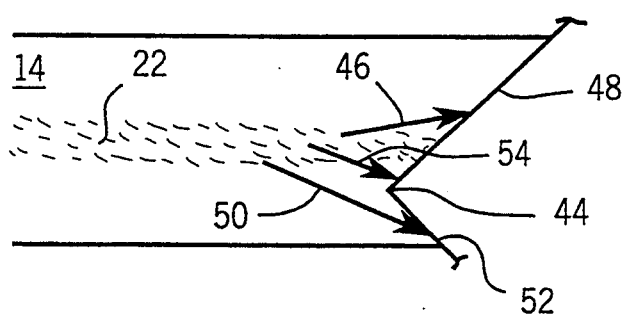
FIG. 3 shows an alternative, though not preferred, embodiment.

It is not critical that apex 38 be exactly at quantum well 22. For example, apex 44 in FIG. 3 is slightly below and offset from quantum well 22. Photons traveling laterally upwardly from the dipoles, for example as shown at travel path ray 46, will still impinge upper leg 48 sidewall at an angle of incidence greater than the critical angle for internal reflection. Photons traveling laterally and downwardly as shown at 50 and impinging lower leg sidewall 52 below apex 44 will still impinge such sidewall 52 at an angle of incidence greater than the critical angle for internal reflection. Some of the photons as shown at 54 traveling laterally and downwardly will strike sidewall 48 above apex 44 at an angle of incidence less than the critical angle for internal reflection, and hence may escape laterally outwardly rightwardly in FIG. 3. However, this is a small percentage of photons, which percentage becomes less and less from those dipoles further leftwardly in FIG. 3.

Figure 4:
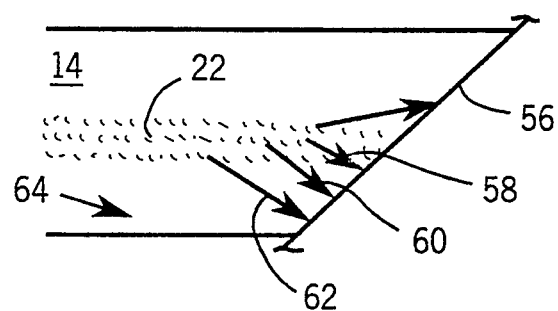
FIG. 4 shows an undesirable embodiment.

The farther that apex 44, FIG. 3, is offset from quantum well 22, the greater percentage of photons escaping the active cavity region. For example, FIG. 4 shows a structure with only a diagonal sidewall 56, with no V-shaped notch and no apex of such V, or where the apex of the V is below the active region. In such case, a significantly higher percentage of the photons, for example as shown at rays 58, 60, 62 impinge sidewall 56 at an angle of incidence less than the critical angle for internal reflection, which is undesirable in the present invention. The diagonal sidewall structure 56 in FIG. 4 may be desirably used in the present invention if quantum well 22 were at area 64, because then the spontaneously emitted photons from hole-electron pairs in such downwardly shifted quantum well at area 64 would impinge sidewall 56 at an angle of incidence greater than the critical angle for internal reflection.

Figure 5:
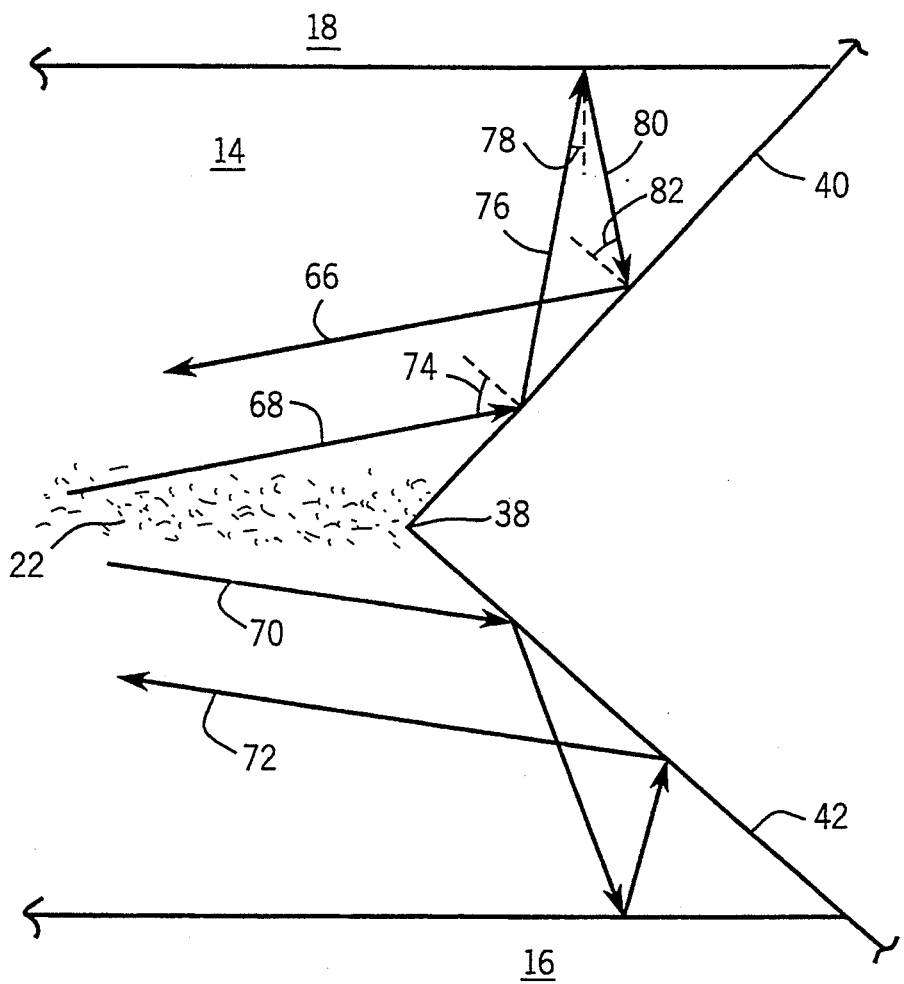
FIG. 5 shows a portion of the structure of FIG. 2.

The invention reduces lateral traveling mode density by reducing the number of traveling modes available to spontaneous emission of photons in the active region, to increase emission to axial normal modes, to lower lasing threshold. The sidewall of the active region is contoured to internally reflect laterally traveling photons back into the active cavity region, to suppress escape of traveling modes from the active cavity region. Laterally traveling photons are reflected internally along a repeating closed loop path in active cavity region 14. The internally reflected laterally traveling photons cross quantum well 22 along paths such as 66, 68, 70, 72, FIG. 5, nearly parallel to and forming only a small angle with the lateral extension of quantum well 22. The sidewall of the active region is contoured such that traveling mode photons impinge such sidewall at an angle of incidence 74 greater than 17°. Photons internally reflected as at 76 from the sidewall impinge the respective DBR stack at an angle of incidence 78 less than 20°. Photons internally reflected as at 80 from the DBR stack impinge the sidewall at an angle of incidence 82 greater than 17° and are internally reflected at 66 in a direction parallel to initially incident direction 68. This parallelism ensures that laterally traveling photons do not escape the active cavity region 14 even after many reflections from the contoured sidewall and the DBR stacks.

The noted contoured sidewall of the active cavity region provides a traveling mode suppressor or mirror reducing the number of lateral traveling modes available to spontaneous emission of photons in the active cavity region, to reduce spontaneous emission losses into lateral traveling modes, to increase spontaneous emission into axial normal modes, to lower lasing threshold. Such suppressor reflects laterally traveling photons internally back into the active cavity region to suppress escape of traveling modes. The beveled contour provides a spindle shaped sidewall.

A further benefit of the invention is reduced diffractive radiation. Diffractive radiation from a straight sidewall 32, FIG. 1, tends to provide parallel horizontal radiation patterns which tend to couple and enhance each other. In contrast, any diffractive radiation from the V-shaped notch 36, FIG. 2, have opposing components from sidewalls 40 and 42 which tend to reduce coupling of any such diffractive radiation, and hence reduce same.

A significant advantage of the invention is that it enables usage of a conventional VCSEL epitaxial crystal structure diode, and requires only a simple modification to lower lasing threshold. By suppressing lateral traveling modes, increased axial laser light at 28 is provided for lower injection currents. Since the lateral traveling modes are no longer available to spontaneous emission from the dipoles in the quantum well, such energy instead is coupled into axial and lateral normal modes.

It is recognized that various equivalents, alternatives and modifications are possible within the scope of the appended claims.

We claim:

1. A method for reducing the lasing threshold of a VCSEL, vertical cavity surface emitting laser, wherein said VCSEL comprises a VCSEL diode having a plurality of laterally extending layers, one on top of another in an axial stack, including an active cavity region sandwiched between an n type multi-layer DBR, distributed Bragg reflector, stack, and a p type multi-layer DBR stack, said method comprising suppressing spontaneous emission into lateral traveling modes, to increase spontaneous emission into axial normal modes, to lower lasing threshold.

2. The method according to claim 1 comprising suppressing emission of photons in said active cavity region into traveling modes by suppressing traveling modes from said active cavity region.

3. The method according to claim 2 comprising suppressing traveling modes by reflecting laterally traveling photons internally back into said active cavity region.

4. The method according to claim 3 comprising reflecting laterally traveling photons internally by contouring the sidewall of said active cavity region to provide internal reflection.

5. The method according to claim 4 comprising etching the sidewall of said active cavity region along an angle to provide said contour.

6. The method according to claim 5 wherein said active cavity region includes a plurality of hole-electron pairs forming dipoles along a laterally extending quantum well, and comprising etching the sidewall of said active cavity region along a diagonal etch line intersecting said quantum well at an angle such that spontaneously emitted photons from dipoles along said quantum well impinge said sidewall at an angle of incidence greater than the critical angle for internal reflection.

7. The method according to claim 6 wherein said quantum well is spaced centrally between said p and n type DBR stacks, and comprising etching said sidewall of said active cavity region along said angle to form a V-shaped notch in said sidewall, with the apex of the V substantially at said quantum well, the V shape having an upper leg extending downwardly and inwardly to said apex, and having a lower leg extending downwardly and outwardly from said apex, such that spontaneously emitted photons from dipoles along said quantum well impinge said sidewall along said upper leg of the V at an angle of incidence greater than the critical angle for internal reflection, and such that spontaneously emitted photons from dipoles along said quantum well impinge said sidewall along said lower leg of the V at an angle of incidence greater than the critical angle for internal reflection.

8. The method according to claim 7 comprising forming said V-shaped notch with a 90° angle between said legs at said apex.

9. The method according to claim 6 comprising etching the sidewall of said active cavity region by directing an ion flux beam at an angle toward said sidewall and simultaneously rotating at least one of said VCSEL and said ion flux beam about an axially extending rotational axis.

10. The method according to claim 9 comprising directing said ion beam along a 45° angle relative to said rotational axis.

11. The method according to claim 9 comprising forming a V-shaped notch in said sidewall, the V-shape having an apex in said active cavity region, an upper leg extending downwardly and inwardly to said apex, and a lower leg extending downwardly and outwardly from said apex, and comprising controlling the length of said upper leg by the time duration and intensity of said ion beam, and controlling the length of said lower leg by the width of a mask opening.

12. The method according to claim 11 comprising controlling the length of said upper leg such that said apex is substantially at said quantum well.

13. The method according to claim 11 comprising controlling said lengths of said legs to be substantially the same.

14. A method for reducing the lasing threshold of a VCSEL, vertical cavity surface emitting laser, wherein said VCSEL comprises a VCSEL diode having a plurality of laterally extending layers, one on top of another in an axial stack, including an active cavity region sandwiched between an n type multi-layer DBR, distributed Bragg reflector, stack, and a p type multi-layer DBR stack, said active region including a plurality of hole-electron pairs forming dipoles along a laterally extending quantum well, said method comprising internally reflecting laterally traveling photons back into said active region along a repeating closed loop path.

15. A method for reducing the lasing threshold of a VCSEL, vertical cavity surface emitting laser, wherein said VCSEL comprises a VCSEL diode having a plurality of laterally extending layers, one on top of another in an axial stack, including an active cavity region sandwiched between an n type multi-layer DBR, distributed Bragg reflector, stack, and a p type multi-layer DBR stack, said active region including a plurality of hole-electron pairs forming dipoles along a laterally extending quantum well, said method comprising internally reflecting laterally traveling photons to cross said quantum well along travel paths nearly parallel to and forming a small angle with the lateral extension of said quantum well.

16. The method according to claim 15 comprising contouring the sidewall of said active cavity region to provide said internal reflection, and providing substantially parallel internally reflected travel paths ensuring that laterally traveling photons do not escape said active cavity region even after many reflections from said contoured sidewall and said DBR stacks.

17. A method for reducing the lasing threshold of a VCSEL, vertical cavity surface emitting laser, wherein said VCSEL comprises a VCSEL diode having a plurality of laterally extending layers, one on top of another in an axial stack, including an active cavity region sandwiched between an n type multi-layer DBR, distributed Bragg reflector, stack, and a p type multi-layer DBR stack, said method comprising reducing lateral traveling mode density by reducing the number of lateral traveling modes available to spontaneous emission of photons in said active cavity region, to increase emission to axial normal modes, to lower lasing threshold.

18. The method according to claim 17 comprising contouring the sidewall of said active cavity region to internally reflect laterally traveling photons back into said active region, to suppress escape of laterally traveling photons from said active region.

19. The method according to claim 18 comprising contouring said sidewall of said active cavity region such that laterally traveling photons impinge said sidewall at an angle of incidence greater than the critical angle for total internal reflection.

20. A VCSEL, vertical cavity surface emitting laser, diode comprising a plurality of laterally extending layers, one on top of another in an axial stack, including an active cavity region sandwiched between an n type multi-layer DBR, distributed Bragg reflector, stack, and a p type multi-layer DBR stack, means suppressing lateral traveling modes by reducing the number of lateral traveling modes available to spontaneous emission of photons in said active cavity region, to increase spontaneous emission into axial normal modes, to lower lasing threshold.

21. The invention according to claim 20 wherein said traveling mode suppressor reflects laterally traveling photons internally back into said active region to suppress traveling modes.

22. The invention according to claim 21 wherein said traveling mode suppressor comprises a contoured sidewall of said active cavity region providing said internal reflection.

23. A VCSEL, vertical cavity surface emitting laser, diode comprising a plurality of laterally extending layers, one on top of another in an axial stack, including an active cavity region sandwiched between an n type multi-layer DBR, distributed Bragg reflector, stack, and a p type multi-layer DBR stack, said active cavity region having a spindle shaped sidewall.

24. The invention according to claim 23 wherein said spindle shape is provided by a V-shaped notch in said sidewall.

25. The invention according to claim 24 wherein said active cavity region includes a plurality of hole-electron pairs forming dipoles along a laterally extending quantum well, and wherein the apex of said V-shaped notch is substantially at said quantum well.

* * * * *

UNITED STATES PATENT AND TRADEMARK OFFICE
CERTIFICATE OF CORRECTION

PATENT NO. : 5,420,880
DATED : May 30, 1995
INVENTOR(S) : NED TABATABAIE ET AL

It is certified that error appears in the above-identified patent and that said Letters Patent is hereby corrected as shown below:

Column 1, line 4:

Please insert the following as the first paragraph of the specification:

-- This invention was made with United States Government support awarded by the National Science Foundation (NSF), Grant No. ECS-9058153. The United States Government has certain rights in this invention. --

Signed and Sealed this

Twenty-sixth Day of September, 1995

Attest:

BRUCE LEHMAN

Attesting Officer     Commissioner of Patents and Trademarks